(12) United States Patent
Wang et al.

(10) Patent No.: US 12,342,689 B2
(45) Date of Patent: Jun. 24, 2025

(54) DISPLAY SUBSTRATE, METHOD FOR MANUFACTURING SAME, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Yanqiang Wang, Beijing (CN); Tao Gao, Beijing (CN); Peng Huang, Beijing (CN); Ke Liu, Beijing (CN); Yuanzheng Guo, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 627 days.

(21) Appl. No.: 17/517,300

(22) Filed: Nov. 2, 2021

(65) Prior Publication Data

US 2022/0149137 A1    May 12, 2022

(30) Foreign Application Priority Data

Nov. 11, 2020 (CN) .......................... 202011254867.1

(51) Int. Cl.
*H10D 30/67*    (2025.01)
*H10K 59/121*    (2023.01)
(Continued)

(52) U.S. Cl.
CPC ....... *H10K 59/126* (2023.02); *H10D 30/6745* (2025.01); *H10D 30/6755* (2025.01);
(Continued)

(58) Field of Classification Search
CPC ............ H10K 59/126; H10K 59/1213; H10K 59/1216; H10K 59/1201; H10K 59/12;
(Continued)

(56) References Cited

U.S. PATENT DOCUMENTS

| 11,121,186 B2 * | 9/2021 | Kim ..................... H10K 50/828 |
| 2019/0214504 A1 | 7/2019 | Song et al. |

(Continued)

FOREIGN PATENT DOCUMENTS

| CN | 109686770 A | 4/2019 |
| CN | 109859647 A | 6/2019 |
| CN | 111554695 A | 8/2020 |

OTHER PUBLICATIONS

CN202011254867.1 Notification to grant patent for invention.

*Primary Examiner* — Tan N Tran
(74) *Attorney, Agent, or Firm* — IPro, PLLC

(57) ABSTRACT

A display substrate is provided. The display substrate includes: a base substrate; a light-shielding layer disposed on the base substrate, the light-shielding layer comprising a light-shielding region; and a pixel drive layer disposed on a side of the light-shielding layer away from the base substrate, the pixel drive layer including at least one first thin-film transistor, at least one second thin-film transistor, and a first electrode plate of at least one storage capacitor, wherein the first thin-film transistor is disposed in correspondence with the light-shielding region, the second thin-film transistor in correspondence with the light-shielding region, and the at least one first electrode plate are disposed in correspondence with the light-shielding region.

20 Claims, 5 Drawing Sheets

(51) Int. Cl.
*H10K 59/126* (2023.01)
*H10K 59/12* (2023.01)

(52) U.S. Cl.
CPC ..... *H10K 59/1213* (2023.02); *H10K 59/1216* (2023.02); *H10K 59/1201* (2023.02)

(58) Field of Classification Search
CPC .............. H10K 71/00; H10D 30/6745; H10D 30/6755; H10D 30/6723; H10D 86/481; H10D 86/423; H10D 86/60; H10D 86/40; H01L 29/78672; H01L 29/7869; H01L 27/1255; H01L 27/1225; H01L 29/78633; H01L 27/1214
USPC ....................................................... 257/59, 72
See application file for complete search history.

(56) References Cited

U.S. PATENT DOCUMENTS

2020/0111815 A1* 4/2020 Lius ..................... G06F 3/0412
2020/0203468 A1 6/2020 Zeng et al.
2020/0312831 A1 10/2020 He et al.

\* cited by examiner

DISPLAY SUBSTRATE, METHOD FOR MANUFACTURING SAME, AND DISPLAY APPARATUS

CROSS-REFERENCE TO RELATED APPLICATION

This application claims priority to Chinese Patent Application No. 202011254867.1, filed on Nov. 11, 2020 and entitled "DISPLAY SUBSTRATE, METHOD FOR MANUFACTURING SAME, AND DISPLAY APPARATUS", the content of which is incorporated herein by reference in its entirety.

TECHNICAL FIELD

The present disclosure relates to the field of panel display technologies, and in particular, relates to a display substrate, a method for manufacturing the same, and a display apparatus.

BACKGROUND

Organic light-emitting diode (OLED) technology is one of the research hotspots in the field of display technologies today. OLED display panels have been widely used for the advantages such as wide viewing angle, high contrast ratio, and low power consumption. An OLED display panel generally includes an organic light-emitting device configured to display images and a pixel drive layer configured to drive the organic light-emitting device to display images. The pixel drive layer generally includes thin-film transistors and a storage capacitor arranged in an array.

With the maturity of technologies, there emerges an OLED display panel in which low-temperature poly-silicon (LTPS) thin-film transistors and oxide semiconductor thin-film transistors are formed on the same base substrate at the same time.

SUMMARY

In a first aspect, the present disclosure provides a display substrate. The display substrate includes: a base substrate; a light-shielding layer disposed on the base substrate, the light-shielding layer including a light-shielding region; and a pixel drive layer disposed on a side of the light-shielding layer away from the base substrate, the pixel drive layer including at least one first thin-film transistor, at least one second thin-film transistor, and a first electrode plate of at least one storage capacitor, wherein the first thin-film transistor is disposed in correspondence with the light-shielding region, the second thin-film transistor in correspondence with the light-shielding region, and the at least one first electrode plate are disposed in correspondence with the light-shielding region.

Optionally, a plurality of light-shielding regions are provided, and the plurality of light-shielding regions include at least one first light-shielding region, at least one second light-shielding region, and at least one third light-shielding region, wherein the at least one first thin-film transistor is disposed in one-to-one correspondence with the at least one first light-shielding region, the at least one second thin-film transistor is disposed in one-to-one correspondence with the at least one second light-shielding region, and the at least one first electrode plate is disposed in one-to-one correspondence with the at least one third light-shielding region.

Optionally, the first thin-film transistor includes a first active layer, and an orthographic projection of the first light-shielding region on the base substrate is at least partially overlapped with an orthographic projection of the first active layer on the base substrate.

Optionally, an area of the orthographic projection of the first light-shielding region on the base substrate is not smaller than an area of the orthographic projection of the first active layer on the base substrate.

Optionally, the second thin-film transistor includes a second active layer, and an orthographic projection of the second light-shielding region on the base substrate is at least partially overlapped with an orthographic projection of the second active layer on the base substrate.

Optionally, an area of the orthographic projection of the second light-shielding region on the base substrate is larger than or equal to an area of the orthographic projection of the second active layer on the base substrate.

Optionally, an orthographic projection of the third light-shielding region on the base substrate is at least partially overlapped with an orthographic projection of the first electrode plate on the base substrate.

Optionally, an area of the orthographic projection of the third light-shielding region on the base substrate is larger than or equal to an area of the orthographic projection of the first electrode plate on the base substrate.

Optionally, the pixel drive layer further includes a first gate insulating layer, the first gate insulating layer being disposed between the first electrode plate and the light-shielding region.

Optionally, the first gate insulating layer has a dielectric constant not less than 7.

Optionally, the light-shielding layer is made of an opaque metal material.

Optionally, the opaque metal material includes metal tantalum.

Optionally, the first thin-film transistor is a low-temperature poly-silicon thin-film transistor.

Optionally, the second thin-film transistor is an oxide thin-film transistor.

Optionally, the pixel drive layer further includes a first buffer layer, the first buffer layer being disposed between a second active layer of the second thin-film transistor and the light-shielding region.

Optionally, the display substrate further includes a second buffer layer, the second buffer layer being disposed between the light-shielding region and the pixel drive layer.

In a second aspect, the present disclosure provides a method for manufacturing a display substrate. The method includes: forming a light-shielding layer on a base substrate, wherein the light-shielding layer includes a light-shielding region; and forming a pixel drive layer on a side of the light-shielding layer away from the base substrate, wherein the pixel drive layer includes at least one first thin-film transistor, at least one second thin-film transistor, and a first electrode plate of at least one storage capacitor, wherein the first thin-film transistor is disposed in correspondence with the light-shielding region, the second thin-film transistor is disposed in correspondence with the light-shielding region, and the first electrode plate is disposed in correspondence with the light-shielding region.

Optionally, forming the light-shielding layer on the base substrate includes: forming a thin film on the base substrate by using a light-shielding material; and etching the thin film to form the light-shielding layer including the plurality of light-shielding regions.

Optionally, prior to forming the pixel drive layer, the method further includes: forming a second buffer layer on the side of the light-shielding layer away from the base substrate.

In a third aspect, the present disclosure provides a display apparatus. The display apparatus includes a display panel, wherein the display panel includes: a base substrate; a light-shielding layer disposed on the base substrate, the light-shielding layer including a light-shielding region; a pixel drive layer disposed on a side of the light-shielding layer away from the base substrate, the pixel drive layer including at least one first thin-film transistor, at least one second thin-film transistor, and a first electrode plate of at least one storage capacitor, wherein the first thin-film transistor is disposed in correspondence with the light-shielding region, the second thin-film transistor is disposed in correspondence with the light-shielding region, and the first electrode plate is disposed in correspondence with the light-shielding region; and a display function layer disposed on a side of the pixel drive layer away from the base substrate.

DETAILED DESCRIPTION

The present disclosure will be further described below in conjunction with the accompanying drawings and the embodiments. It should be understood that the specific embodiments described herein are merely for the purpose of illustrating the present disclosure, but are not intended to limit the present disclosure. In addition, it should also be noted that, for the convenience of description, the accompanying drawings only illustrate part related to the present disclosure.

It should be noted that the embodiments and the features therein in the present disclosure can be mutually combined in the absence of conflicts. The present disclosure will be illustrated in detail below with reference to the accompanying drawings and in conjunction with the embodiments.

Figure 1:
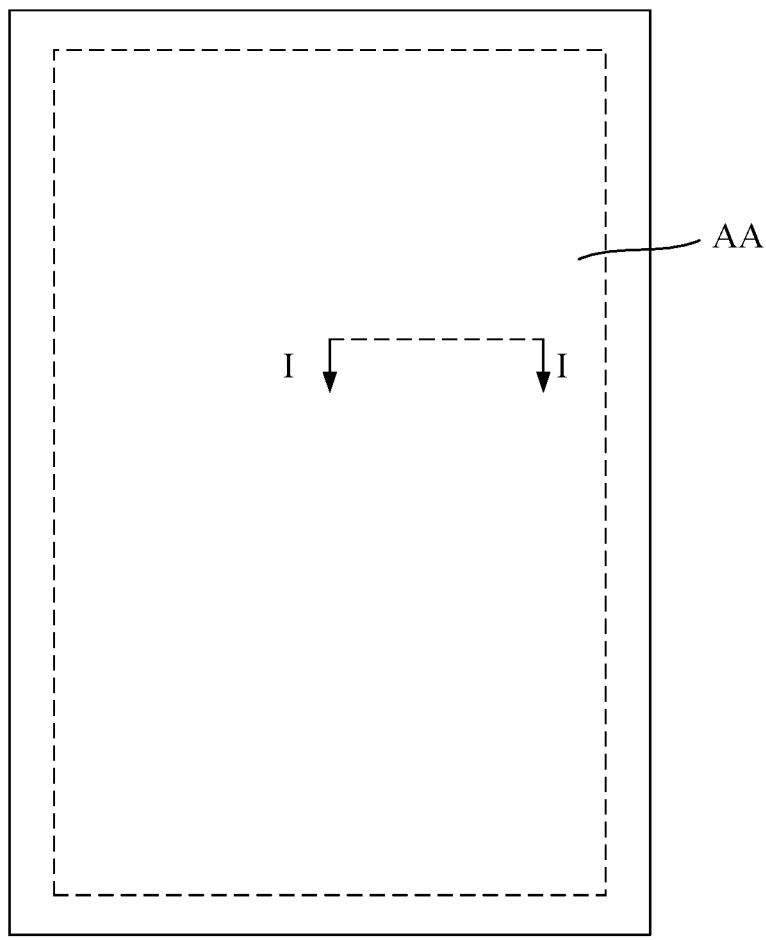
FIG. 1 is a top view of a display panel in the related art.
Figure 2:
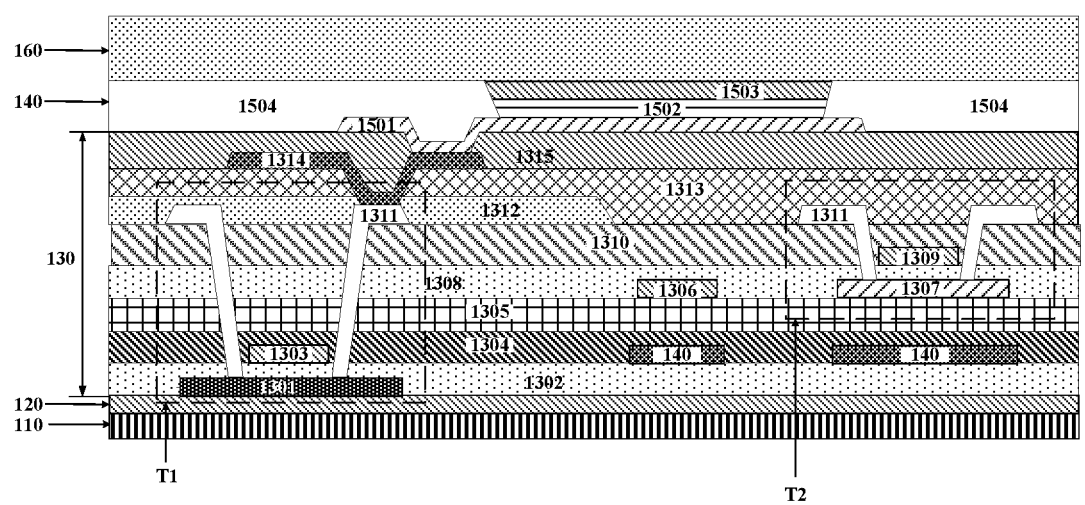
FIG. 2 is a sectional-view along I-I in FIG. 1.

FIG. 1 is a top view of a display panel in the related art. The display panel includes a display region, that is, the region AA. FIG. 2 is a sectional view taken along I-I in FIG. 1, and FIG. 2 schematically shows a part of the structure, in the display region (the region AA), of the display panel. As shown in FIG. 2, the display panel includes a base substrate 110, a second buffer layer 120 disposed on the base substrate 110, and a pixel drive layer 130 and a display function layer 150 which are sequentially disposed on a side of the second buffer layer 120 away from the base substrate 110.

Still referring to FIG. 2, the pixel drive layer 130 includes: a first active layer 1301, a second gate insulating layer 1302, a first gate layer 1303 and a light-shielding layer 140 disposed in the same layer as the first gate layer 1303, a first gate insulating layer 1304, a first buffer layer 1305, a first electrode plate 1306 and a second active layer 1307 disposed in the same layer as the first electrode plate 1306, a third gate insulating layer 1308, a second gate layer 1309, an interlayer dielectric layer 1310, a first source-drain layer 1311, a passivation layer 1312, a first planarization layer 1313, a second source-drain layer 1314, and a second planarization layer 1315, which are sequentially disposed on the side of the second buffer layer 120 away from the base substrate 110.

The first active layer 1301 may be made of a poly-silicon material. The second gate insulating layer 1302, the first gate insulating layer 1304, the first buffer layer 1305, the third gate insulating layer 1308, and the interlayer dielectric layer 1310 are provided with via holes, and the first source-drain layer 1311 is connected to the first active layer 1301 through the via holes. The first active layer 1301, the first source-drain layer 1311, and the first gate layer 1303 form a first thin-film transistor T1, which is an LTPS thin-film transistor. When the LTPS thin-film transistor is a dual source-drain thin-film transistor, still referring to FIG. 2, the passivation layer 1312 and the first planarization layer 1313 are provided with a via hole, such that the second source-drain layer 1314 is connected to the first source-drain layer 1311 through the via hole.

The second active layer 1307 may be made of an oxide material. The first source-drain layer 1311 is connected to the second active layer 1307 through the via holes in the third gate insulating layer 1308 and the interlayer dielectric layer 1310. The second active layer 1307, the first source-drain layer 1311, and the second gate layer 1309 form a second thin-film transistor T2, which is an oxide transistor.

Still referring to FIG. 2, the display function layer 150 includes an organic light-emitting device disposed on a side of the second planarization layer 1315 away from the base substrate 110. The organic light-emitting device includes a first electrode layer 1501, an organic light-emitting layer 1502, and a second electrode layer 1503. The first electrode layer 1501 is an anode layer, and the second electrode layer 1503 is a cathode layer. Alternatively, the first electrode layer 1501 is a cathode layer, and the second electrode layer is an anode layer. Here, the first electrode layer 1501 is connected to the second source-drain layer 1314 through a via hole in the second planarization layer 1315, and the position of the light-emitting device is determined by a pixel defining layer 1504 that is disposed in the same layer as the light-emitting device. Optionally, the display panel further includes a thin-film encapsulation layer 160, which is configured to encapsulate the functional film layers in the display panel to prevent moisture and oxygen in the air from corroding the functional film layers in the display panel.

In the related art, the material of the light-shielding layer 140 in the display panel may be a light-shielding metal. A part of a light-shielding region of the light-shielding layer 140 is disposed in correspondence with the first electrode plate 1306 to form a storage capacitor. 注意 of ambient light, thereby preventing the voltage stabilization performance of the storage capacitor from being affected. Another part of the light-shielding region of the light-shielding layer 140 is disposed in correspondence with the second active layer 1307, and the light-shielding layer 140 can protect the second active layer 1307 against aging due to the irradiation of the ambient light, thereby preventing the performance of the oxide transistor from being affected.

However, in the display panel provided in the related art, since the LTPS thin-film transistor is usually affected by the ambient light to result in electric leakage and the capacitance value of the storage capacitor in the display panel is usually small, the light-emitting device is poor in stability when emitting light, resulting in a poor display effect of the display panel. In particular, in the OLED display panel, the pixel drive layer is needed to supply a stable current to control the light emission of the organic light-emitting device, and the ambient light greatly affects the display effect.

Figure 3:
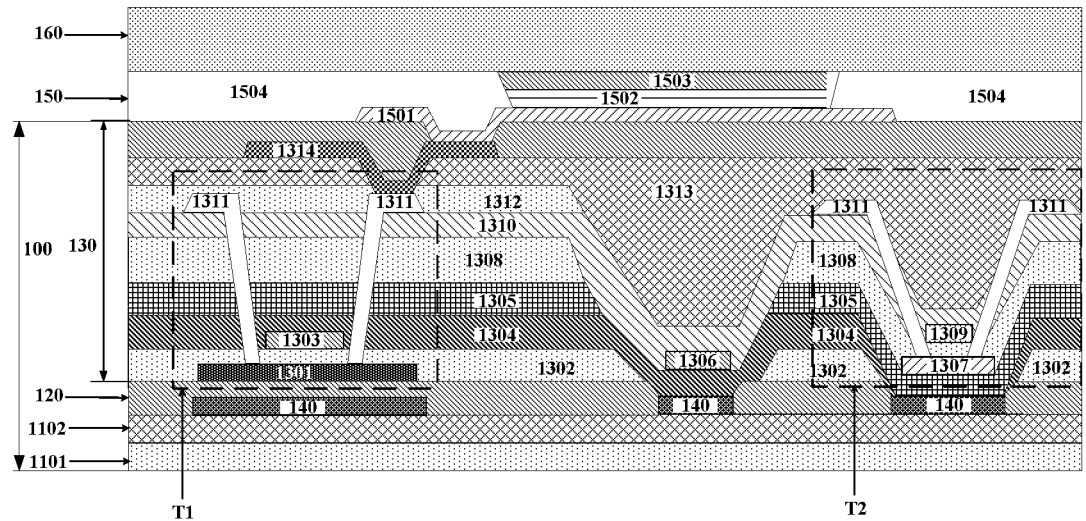
FIG. 3 is a schematic structural diagram of a display panel according to an embodiment of the present disclosure.

An embodiment of the present disclosure provides a display panel. As shown in FIG. 3, the display panel includes a display substrate 100 and a display function layer 150. The display substrate 100 includes a base substrate 110, a light-shielding layer 140 and a pixel drive layer 130. The light-shielding layer 140 is disposed on the base substrate 110, and the pixel drive layer 130 is disposed on the side of the light-shielding layer 140 away from the base substrate 110.

The base substrate 110 may include a base 1101 and a barrier layer 1102, and the base 1101 may be made of a flexible material or a glass material. When the display panel is a flexible display panel, the base 1101 is made of a flexible material, for example, polyimide (PI). The barrier layer 1102 is configured to protect the display panel, to prevent the display panel from being corroded by moisture and oxygen in the environment, and to prevent the display panel from being affected by external electrical signals. The barrier layer 1102 may be made of an inorganic material, such as silicon nitride (SiNx).

The light-shielding layer 140 is disposed on the base substrate 110 and includes light-shielding regions 140. The light-shielding layer 140 may be made of an opaque metal material. For example, the opaque metal material may be metal tantalum.

The pixel drive layer 130 is disposed on the side of the light-shielding layer 140 away from the base substrate 110. The pixel drive layer 130 includes at least one first thin-film transistor T1, at least one second thin-film transistor T2, and a first electrode plate 1306 of at least one storage capacitor. Each first thin-film transistor T1 is disposed in correspondence with a light-shielding region 140, each second thin-film transistor T2 is disposed in correspondence with a light-shielding region 140, and each first electrode plate 1306 is disposed in correspondence with a light-shielding region 140.

The display function layer 150 is disposed on the side of the pixel drive layer 130 away from the base substrate 110. For the structure of the display function layer 150, reference may be made to the structure of the display function layer 150 in FIG. 2, the details of which are not repeated here.

Still referring to FIG. 3, the display substrate 100 further includes a second buffer layer 120. The second buffer layer 120 is disposed between the light-shielding layer 140 and the pixel drive layer 130. The display panel further includes a thin-film encapsulation layer 160. The thin-film encapsulation layer 160 is disposed on the side of the display function layer 130 away from the base substrate 110.

The pixel drive layer 130 includes: a first active layer 1301, a second gate insulating layer 1302, a first gate layer 1303, a first gate insulating layer 1304, a first buffer layer 1305, a first electrode plate 1306, a second active layer 1307, a third gate insulating layer 1308, a second gate layer 1309, an interlayer dielectric layer 1310, a first source-drain layer 1311, a passivation layer 1312, a first planarization layer 1313, a second source-drain layer 1314, and a second planarization layer 1315, which are disposed on the side of the second buffer layer 120 away from the base substrate 110.

Figure 4:
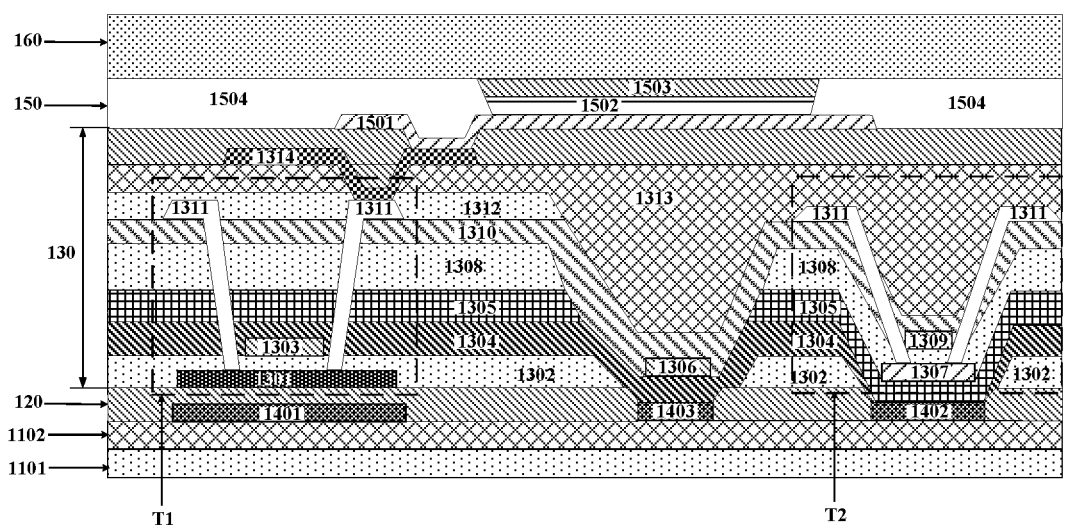
FIG. 4 is a schematic structural diagram of another display panel according to an embodiment of the present disclosure.

Optionally, as shown in FIG. 4, a plurality of light-shielding regions 140 are provided in the embodiment of the present disclosure. The plurality of light-shielding regions 140 in the display panel include at least one first light-shielding region 1401, at least one second light-shielding region 1402, and at least one third light-shielding region 1403. The at least one first thin-film transistor T1 is disposed in one-to-one correspondence with the at least one first light-shielding region 1401; the at least one second thin-film transistor T2 is disposed in one-to-one correspondence with the at least one second light-shielding region 1402; and the at least one first electrode plate 1306 is disposed in one-to-one correspondence with the at least one third light-shielding region 1403.

Still referring to FIG. 4, the first thin-film transistor T1 may be a dual source-drain thin-film transistor. For the structure of the first thin-film transistor T1, reference may be made to the structure of the first thin-film transistor in the display panel shown in FIG. 2, the details of which are not repeated here. The first active layer 1301 of the first thin-film transistor T1 may be made of a poly-silicon material, and thus the first thin-film transistor T1 is an LTPS thin-film transistor. Due to the good response characteristic, the LTPS thin-film transistor may be used as a driving thin-film transistor of the light-emitting device.

In the display panel, the orthographic projection of the first light-shielding region 1401 on the base substrate 110 is partially or totally overlapped with the orthographic projection of the first active layer 1301 on the base substrate 110. The area of the orthographic projection of the first light-shielding region 1401 on the base substrate 110 may be larger than or equal to the area of the orthographic projection of the first active layer 1301 on the base substrate 110.

As an example, in the embodiment of the present disclosure, the orthographic projection of the first active layer 1301 on the base substrate 110 is within the orthographic projection of the first light-shielding region 1401 on the base substrate 110. The first light-shielding region 1401 can shield the ambient light irradiating the first active layer 1301, to reduce or prevent the electric leakage of the driving thin-film transistor in the process of driving the light-emitting device to emit light, so as to prevent the irradiation of the ambient light from affecting the normal operation of the driving thin-film transistor.

For the structure of the second thin-film transistor T2, reference may be made to the structure of the second thin-film transistor in the display panel shown in FIG. 2, the details of which are not repeated here. The second active layer 1307 of the second thin-film transistor T2 may be made of an oxide material, and thus the second thin-film transistor T2 may be an oxide thin-film transistor. Due to the good current cutoff characteristic, the oxide thin-film transistor may be used as a switching thin-film transistor of the light-emitting device.

In the display panel, the orthographic projection of the second light-shielding region 1402 on the base substrate 110 is partially or totally overlapped with the orthographic projection of the second active layer 1307 on the base substrate 110. The area of the orthographic projection of the second light-shielding region 1402 on the base substrate 110 may be larger than or equal to the area of the orthographic projection of the second active layer 1307 on the base substrate 110.

As an example, in the embodiment of the present disclosure, the orthographic projection of the second active layer 1307 on the base substrate 110 is within the orthographic projection of the second light-shielding region 1402 on the base substrate 110. The second light-shielding region 1402 can shield the ambient light irradiating the second active layer 1307 to ensure the current cutoff characteristic of the switching thin-film transistor. The oxide material may be a mixed oxide material composed of three oxides including indium oxide ($In_2O_3$), calcium oxide ($Ga_2O_3$) and zinc oxide (ZnO).

Optionally, as shown in FIG. 4, the second buffer layer 120, the second gate insulating layer 1302, and the first gate insulating layer 1304 which are disposed between the second active layer 1307 of the second thin-film transistor T2 and the second light-shielding region 1402 are provided with a via hole, and the via hole is configured to expose the second light-shielding region 1402. The first buffer layer 1305 is disposed in the via hole, and the second active layer 1307 is disposed on the first buffer layer 1305 and in correspondence with the second light-shielding region 1402. Compared with the display panel provided in the related art, the distance between the second active layer 1307 and the second light-shielding region 1402 is reduced, which can enhance the effect of the second light-shielding region 1402 on shielding the ambient light. In particular, when the area of the second active layer 1307 is equal to that of the second light-shielding region 1402, the small distance therebetween can further improve the effect of the second light-shielding region 1402 on shielding the light irradiated on the second active layer 1307. In addition, the negative-bias temperature instability (NBTI) effect of the display panel can also be improved, so as to improve the display quality of the display panel.

The second buffer layer 120 and the second gate insulating layer 1302 between the first electrode plate 1306 and the third light-shielding region 1403 are provided with a via hole, and the via hole is configured to expose the third light-shielding region 1403. The first gate insulating layer 1304 is disposed in the via hole, and the first electrode plate 1306 is disposed on the first gate insulating layer 1304 and the first electrode plate 1306 is disposed in correspondence with the third light-shielding region 1403. The first electrode plate 1306 and the third light-shielding region 1403 form a storage capacitor in the display panel.

The orthographic projection of the third light-shielding region 1403 on the base substrate 110 is partially or totally overlapped with the orthographic projection of the first electrode plate 1306 on the base substrate 110. The area of the orthographic projection of the third light-shielding region 1403 on the base substrate 110 is larger than or equal to the area of the orthographic projection of the first electrode plate 1306 on the base substrate 110.

As an example, in the embodiment of the present disclosure, the orthographic projection of the first electrode plate 1306 on the base substrate 110 is within the orthographic projection of the third light-shielding region 1403 on the base substrate 110. The third light-shielding region 1403 can shield the ambient light irradiating the first electrode plate 1306, to ensure the voltage stabilization function of the storage capacitor. Compared with the display panel provided in the prior art, the distance between the first electrode plate 1306 and the third light-shielding region 1403 is reduced, which increases the capacitance value of the storage capacitor and ensures the voltage stabilization performance of the storage capacitor.

Optionally, the dielectric constant of the first gate insulating layer 1304 is greater than or equal to 7, which may further increase the capacitance value of the storage capacitor and improve the voltage stabilization performance of the storage capacitor.

In the embodiment of the present disclosure, the first electrode plate of the storage capacitor is connected to a voltage output terminal of the pixel drive layer, and the bottom electrode plate (i.e., the third light-shielding region) of the storage capacitor is connected to the gate of the second thin-film transistor. In the display panel, the light-emitting device in the display panel can be driven through the combined action of the first thin-film transistor, the second thin-film transistor, and the storage capacitor. The light-shielding layer of the display panel can prevent the ambient light from affecting the functions of the first thin-film transistor, the second thin-film transistor and the storage capacitor, thereby ensuring the display quality of the display panel.

Since the light-shielding regions disposed in correspondence with the first thin-film transistor and the second thin-film transistor needn't be connected with circuit signals, in some examples, the light-shielding regions disposed in correspondence with the first thin-film transistor and the second thin-film transistor may be one light-shielding region. That is, the first light-shielding region and the second light-shielding region are connected as a whole, and the first thin-film transistor and the second thin-film transistor correspond to the same light-shielding region.

FIG. 3 merely schematically shows a light-emitting device. In general, the display function layer 150 in the light-emitting region of the display panel includes a plurality of display devices. The display panel includes at least one first thin-film transistor, at least one second thin-film transistor, and at least one storage capacitor, as well as a light-shielding region corresponding to each first thin-film transistor, a light-shielding region corresponding to each second thin-film transistor, and a light-shielding region corresponding to each electrode plate.

In summary, the display panel according to the embodiments of the present disclosure includes: a base substrate, a light-shielding layer, a pixel drive layer and a display function layer. The light-shielding layer is disposed on the base substrate, and the light-shielding layer includes a plurality of light-shielding regions. The pixel drive layer is disposed on the side of the light-shielding layer away from the base substrate, and the pixel drive layer includes at least one first thin-film transistor, at least one second thin-film transistor, and a first electrode plate of at least one storage capacitor. Each first thin-film transistor is correspondingly provided with a light-shielding region, each second thin-film transistor is correspondingly provided with a light-shielding region, and each first electrode plate is correspondingly provided with a light-shielding region. The display function layer is disposed on the side of the pixel drive layer away from the base substrate. By the arrangement of the light-shielding layer, the impact of ambient light on the performance of the thin-film transistors and storage capacitor in the pixel drive layer can be alleviated, and the capacitance value of the storage capacitor can be increased, thereby improving the display quality of the display panel.

Figure 5:
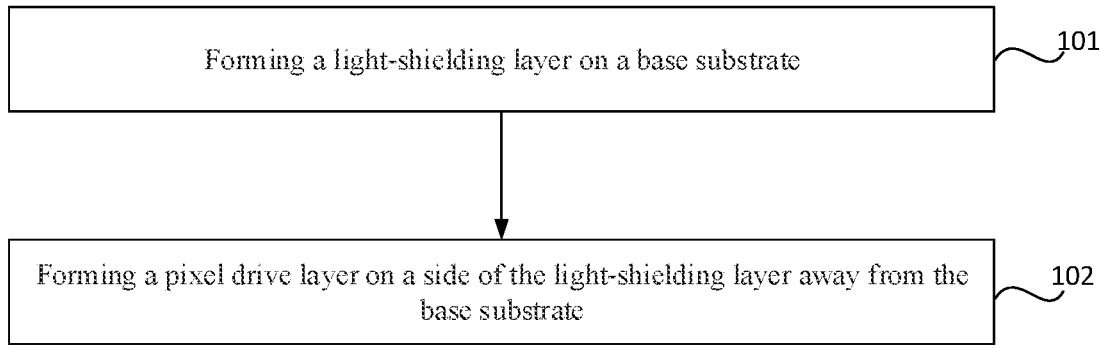
FIG. 5 is a flowchart of manufacturing a display substrate according to an embodiment of the present disclosure.

An embodiment of the present disclosure provides a method for manufacturing a display substrate. The method is applicable to manufacture a display substrate in the display panel shown in FIG. 3 or FIG. 4. As shown in FIG. 5, the method includes the following steps.

In step 101, a light-shielding layer is formed on a base substrate.

The light-shielding layer includes a plurality of light-shielding regions.

In step 102, a pixel drive layer is formed on a side of the light-shielding layer away from the base substrate.

The pixel drive layer includes at least one first thin-film transistor, at least one second thin-film transistor, and a first electrode plate of at least one storage capacitor. The first thin-film transistor is disposed in correspondence with a light-shielding region; the second thin-film transistor is disposed in correspondence with a light-shielding regions; and the first electrode plate is disposed in correspondence with a light-shielding region.

Figure 6:
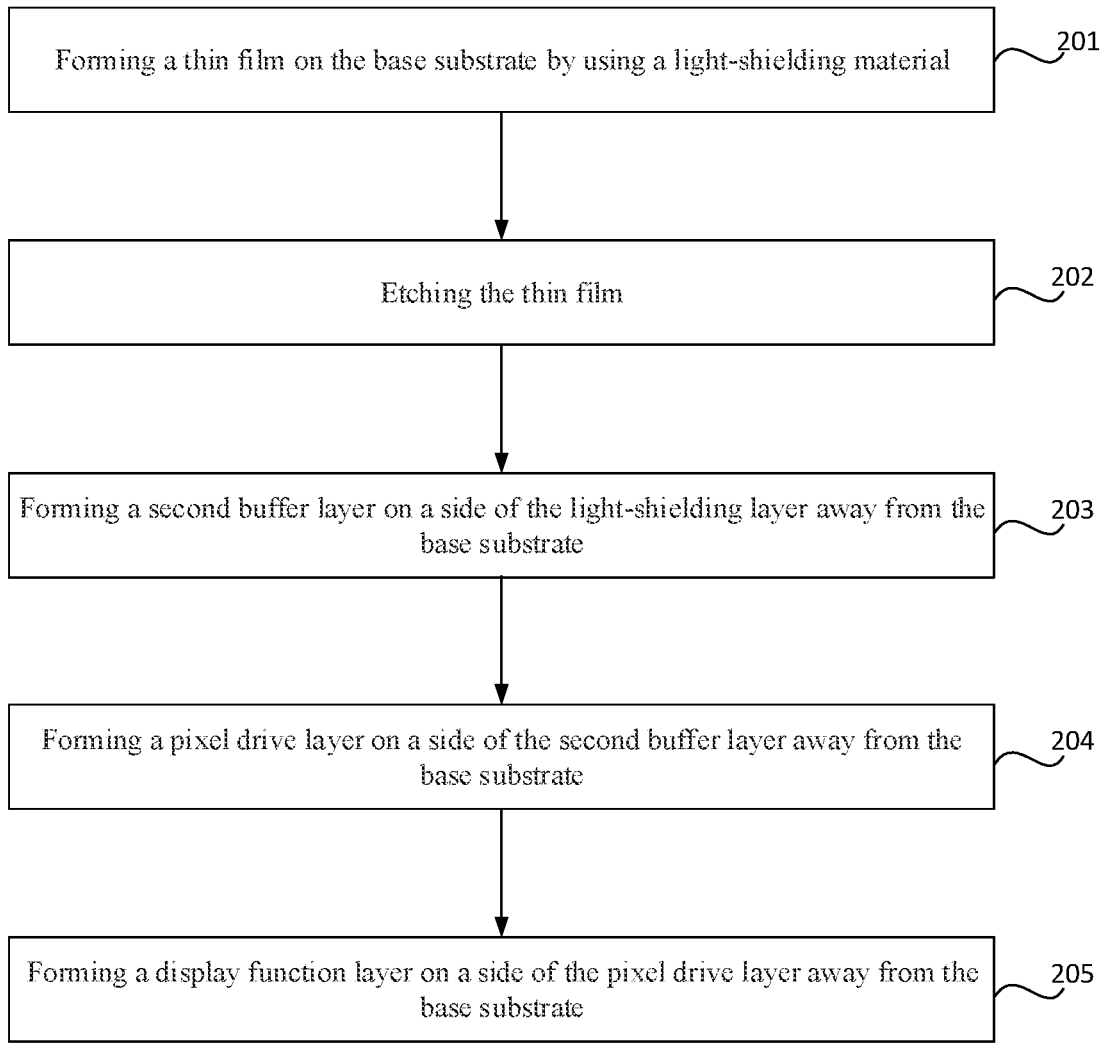
FIG. 6 is a flowchart of manufacturing a display panel according to an embodiment of the present disclosure.

An embodiment of the present disclosure further provides a method for manufacturing a display panel, which is applicable to manufacture the display panel shown in FIG. 3 or FIG. 4. By taking the display panel shown in FIG. 4 as an example, the method for manufacturing the display substrate according to the embodiment of the present disclosure is further described by describing the manufacture of display panel. As shown in FIG. 6, the method includes the following steps.

In step 201, a thin film is formed on the base substrate by using a light-shielding material.

In this step, the thin film may be formed on a side of the base substrate, and the material for forming the thin film may be an opaque metal material, for example, metal tantalum.

In step 202, the thin film is etched.

The thin film is etched to form the light-shielding layer including the plurality of light-shielding regions.

Figure 7:
FIG. 7 is a schematic structural diagram of a display panel in a manufacturing process according to an embodiment of the present disclosure.

Exemplarily, in this step, the thin film is etched by a one-time gray-scale mask process to form a plurality of light-shielding regions. The plurality of light-shielding regions include at least one first light-shielding region, at least one second light-shielding region, and at least one third light-shielding region. The gray-scale mask process is a photolithographic process (also referred to as a patterning process or a graphical process) by using a gray-scale mask, and the gray-scale mask process includes photoresist coating, exposure, development, etching and photoresist stripping. As shown in FIG. 7, the light-shielding layer formed on the base substrate 110 includes a first light-shielding region 1401, a second light-shielding region 1402 and a third light-shielding region 1403.

In step 203, a second buffer layer is formed on a side of the light-shielding layer away from the base substrate.

In this step, the buffer layer may be formed on a side of the base substrate by deposition, coating or sputtering or the like. The buffer layer may be made of silicon dioxide or silicon nitride. The buffer layer may relieve damage to the base substrate caused by external force, and may also prevent impurities from entering the active layer of the thin-film transistor to affect the performance of the thin-film transistor. The second buffer layer may be made of silicon oxide (SiOx).

In step 204, a pixel drive layer is formed on a side of the second buffer layer away from the base substrate.

In the embodiment of the present disclosure, the pixel drive layer includes at least one first thin-film transistor, at least one second thin-film transistor, and at least one storage capacitor.

Exemplarily, in this step, the process of forming the pixel drive layer on the side of the second buffer layer away from the base substrate includes the followings.

Figure 8:
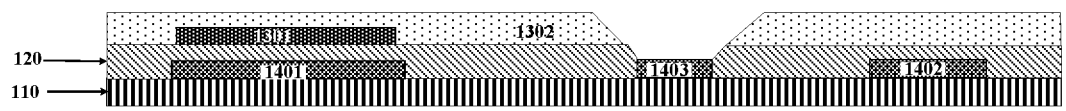
FIG. 8 is a schematic structural diagram of a display panel in another manufacturing process according to an embodiment of the present disclosure.

The first active layer is formed on the side of the second buffer layer away from the base substrate by an excimer laser annealing (ELA) process. The region, corresponding to the first light-shielding region, of the first active layer is retained by a one-time mask process; a second gate insulating layer is formed on the first active layer; a via hole is formed in the second gate insulating layer and the second buffer layer by a mask process to expose the third light-shielding region. Here, the first active layer may be made of a poly-silicon material. As shown in FIG. 8, which is a schematic structural diagram of a display panel in the manufacturing process, the third light-shielding region 1403 is exposed from the via hole in the second buffer layer 120 and the second gate insulating layer 1302.

Figure 9:
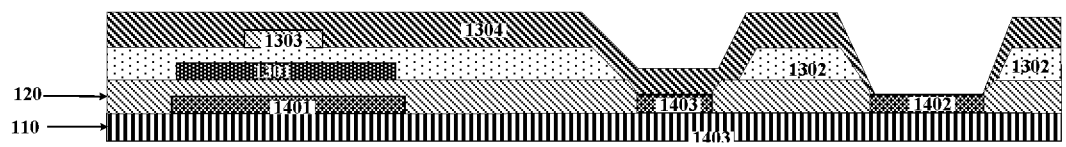
FIG. 9 is a schematic structural diagram of a display panel in still another manufacturing process according to an embodiment of the present disclosure.
Figure 10:
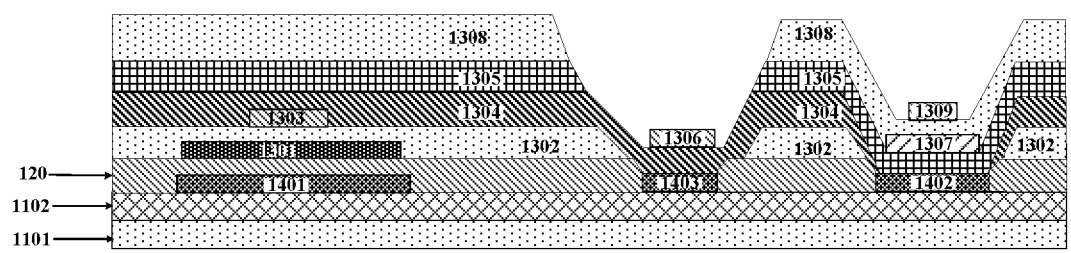
FIG. 10 is a schematic structural diagram of a display panel in still yet another manufacturing process according to an embodiment of the present disclosure.
Figure 11:
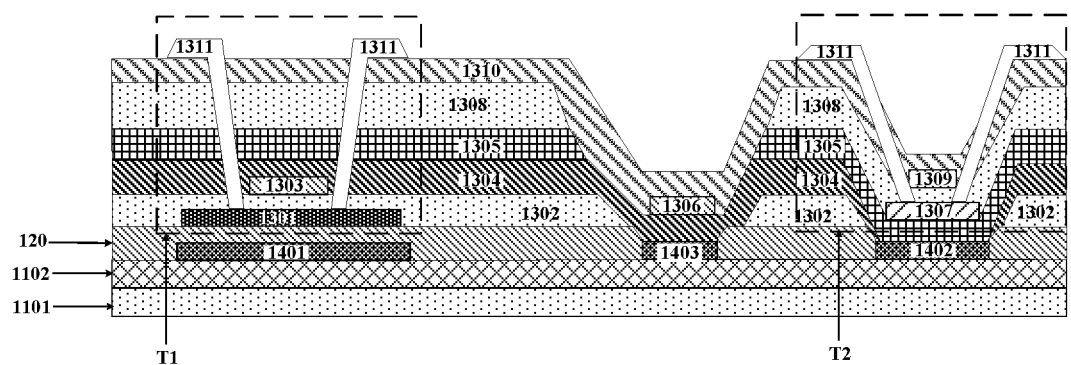
FIG. 11 is a schematic structural diagram of a display panel in still yet another manufacturing process according to an embodiment of the present disclosure.

A first gate layer is formed on the side of the second gate insulating layer away from the base substrate, and a via hole is formed in the first gate insulating layer and the second gate layer to expose the second light-shielding region. Here, the first gate insulating layer may be made of silicon nitride (SiNx), with a dielectric constant generally greater than or equal to 7. As shown in FIG. 9, which is a schematic structural diagram of a display panel in the manufacturing process, the second light-shielding region 1402 is exposed from the via hole in the second buffer layer 120, the second gate insulating layer 1302, and the first gate insulating layer 1304, and the first gate insulating layer 1304 is conformally formed in the via hole corresponding to the third light-shielding region 1403.

A first buffer layer is formed on the side of the first gate insulating layer away from the base substrate; a second buffer layer is formed on the side of the first buffer layer away from the base substrate and in correspondence with the second light-shielding region; a third gate insulating layer is formed on the side of the second active layer away from the base substrate; via holes are formed in the first buffer layer and the third gate insulating layer to expose the portion, corresponding to the third light-shielding region, of the first gate insulating layer; and a conductive metal layer is formed on the side of the third gate insulating layer away from the base substrate.

A first conductive metal portion in the via holes of the first buffer layer and the third gate insulating layer, and a second conductive metal portion corresponding to the second active layer are retained by the one-time mask process. The first conductive metal portion is the first electrode plate. The first electrode plate and the third light-shielding region form a storage capacitor in the display panel. The second conductive metal portion is the second gate layer. As shown in FIG. 20, which is a schematic structural diagram of the display panel in the manufacturing process, by providing the via holes, only one first buffer layer 1305 exists between the second light-shielding region 1402 and the second active layer 1307, which can enhance the effect of the second light-shielding region on shielding the ambient light and improve the negative-bias temperature instability effect of the display panel, thereby improving the display quality of the display panel. The first electrode plate 1306 is disposed on the first gate insulating layer 1304 and in correspondence with the second light-shielding region 1403. Compared with the related art, the distance between the first electrode plate

1306 and the third light-shielding region 1403 is reduced, which increases the capacitance value of the storage capacitor and ensures the voltage stabilization performance of the storage capacitor.

An interlayer dielectric layer is formed on the side of the third gate insulating layer away from the base substrate. A via hole is formed by the one-time patterning process above the first active layer and the via hole penetrates through the second gate insulating layer, the first gate insulating layer, the first buffer layer, the third gate insulating layer, and the interlayer dielectric layer. A first source-drain layer is formed in the via hole. The via hole corresponding to the first active layer and the via hole corresponding to the second active layer may be formed by the one-time mask process, which can reduce the process procedures. For example, the one-time mask process may be implemented by using a half-tone mask to achieve an etching effect with different via-hole depths. FIG. 21 is a schematic structural diagram of the display panel in the manufacturing process. As shown in FIG. 21, the first source-drain layer 1311 is formed through a via hole process to form the first thin-film transistor T1 and the second thin-film transistor T2 in the display panel.

Optionally, if the first thin-film transistor is a dual source-drain thin-film transistor, a passivation layer is formed on the side, away from the base substrate, of the first source-drain layer corresponding to the first thin-film transistor, so as to prevent the source-drain layer from being corroded.

A planarization layer is formed on the side of the passivation layer away from the base substrate, so as to planarize the existing film layers. A via hole is formed in the first planarization layer through the one-time mask process, to expose the first source-drain layer of the first thin-film transistor. A second source-drain layer is formed in the via hole, and a second planarization layer is formed on the side of the second source-drain layer away from the base substrate.

In step 205, a display function layer is formed on a side of the pixel drive layer away from the base substrate.

In this step, the process of forming the display function layer on the side of the pixel drive layer away from the base substrate may be implemented in the following two optional ways based on the type of the first thin-film transistor.

If the first thin-film transistor is a single source-drain thin-film transistor, the process of forming the display function layer may include: forming a via hole in the first planarization layer through the one-time mask process to expose the first source-drain layer; forming a first electrode layer in the via hole, and forming a pixel defining layer on the side of the first electrode layer away from the base substrate; forming a via hole in the pixel defining layer through the one-time patterning process to expose the first electrode layer; and forming an organic light-emitting layer and a second electrode layer on the first electrode layer.

If the first thin-film transistor is a dual source-drain thin-film transistor, the process of forming the display function layer may include, forming a via hole in the second planarization layer through the one-time mask process to expose the second source-drain layer. The subsequent process of forming the light-emitting device is the same as the process of forming the display function layer in the case where the first thin-film transistor is the single source-drain thin-film transistor, and details are not repeated in the embodiment of the present disclosure.

Optionally, a thin-film encapsulation layer is formed on the side of the display function layer away from the base substrate. The thin-film encapsulation layer may prevent the display panel from being corroded by moisture and oxygen in the air. Reference may be made to FIG. 4 for the structure of the display panel after the thin-film encapsulation layer is formed.

It should be noted that, in the embodiments of the present disclosure, different thin-film processes may be adopted depending on the material of each film layer in the processes of forming the respective film layers. The thin-film processes may include deposition, coating, or sputtering and the like.

In summary, the method for manufacturing the display panel according to the embodiments of the present disclosure includes: forming a light-shielding layer on a base substrate; forming a plurality of light-shielding regions by etching the light-shielding layer; forming a second buffer layer on a side of the light-shielding layer away from the base substrate; forming a pixel drive layer on a side of the second buffer layer away from the base substrate, wherein the pixel drive layer includes at least one first thin-film transistor, at least one second thin-film transistor and a first electrode plate of at least one storage capacitor, each of the at least one first thin-film transistor is correspondingly provided with the light-shielding region, each of the at least one second thin-film transistor is correspondingly provided with the light-shielding region, and each of the at least one first electrode plate is correspondingly provided with the light-shielding region; and forming a display function layer on a side of the pixel drive layer away from the base substrate. By the arrangement of the light shied layer, the impact of ambient light on the thin-film transistors and storage capacitor in the pixel drive layer can be alleviated, and the capacitance value of the storage capacitor can be increased, thereby improving the display quality of the display panel.

An embodiment of the present disclosure further provides a display apparatus, which includes the display panel defined above. The display apparatus may be: a liquid crystal panel, electronic paper, a mobile phone, a tablet computer, a television, a monitor, a notebook computer, a digital photo frame, a navigator or any product or component with a display function. Optionally, the display apparatus may be a flexible display apparatus. Optionally, the display apparatus may be a flexible display apparatus.

Described above are merely the preferred embodiments of the present disclosure and the explanation of the applied technical principles. Those skilled in the art should understand that the scope of invention involved in the present disclosure is not limited to the technical solutions formed by the specific combination of the technical features described above, and should also cover other technical solutions formed by the random combination of the technical features described above or equivalent features thereof without departing from the inventive concept, for example, the technical solution formed by the mutual substitution between the features described above and the technical features having similar functions and disclosed (but not limited thereto) in the present disclosure.

What is claimed is:
1. A display substrate, comprising:
   a base substrate;
   a light-shielding layer disposed on the base substrate, the light-shielding layer comprising a light-shielding region; and
   a pixel drive layer disposed on a side of the light-shielding layer away from the base substrate, the pixel drive layer comprising at least one first thin-film transistor, at least one second thin-film transistor, and a first electrode plate of at least one storage capacitor, wherein the first thin-film transistor is disposed in correspondence with the light-shielding region, the second thin-film transistor in correspondence with the light-shielding region, and the at least one first electrode plate are disposed in correspondence with the light-shielding region, and the at least one first electrode plate are disposed in correspondence with the light-shielding region; and wherein the first electrode plate is located between two adjacent first thin-film transistor and second thin-film transistor, and does not overlap with any of the two adjacent first thin-film transistor and second thin-film transistor; and wherein the second thin-film transistor comprises a via hole which is configured to expose the light-shielding region in correspondence with the second thin-film transistor, the second thin-film transistor comprises a second active layer and a second gate layer, and the second active layer and the second gate layer are in the via hole.

2. The display substrate according to claim 1, wherein a plurality of light-shielding regions are provided, and the plurality of light-shielding regions comprise at least one first light-shielding region, at least one second light-shielding region, and at least one third light-shielding region, wherein the at least one first thin-film transistor is disposed in one-to-one correspondence with the at least one first light-shielding region, the at least one second thin-film transistor is disposed in one-to-one correspondence with the at least one second light-shielding region, and the at least one first electrode plate is disposed in one-to-one correspondence with the at least one third light-shielding region.

3. The display substrate according to claim 2, wherein the first thin-film transistor comprises a first active layer, and an orthographic projection of the first light-shielding region on the base substrate is at least partially overlapped with an orthographic projection of the first active layer on the base substrate.

4. The display substrate according to claim 3, wherein an area of the orthographic projection of the first light-shielding region on the base substrate is not smaller than an area of the orthographic projection of the first active layer on the base substrate.

5. The display substrate according to claim 2, wherein an orthographic projection of the second light-shielding region on the base substrate is at least partially overlapped with an orthographic projection of the second active layer on the base substrate.

6. The display substrate according to claim 5, wherein an area of the orthographic projection of the second light-shielding region on the base substrate is larger than or equal to an area of the orthographic projection of the second active layer on the base substrate.

7. The display substrate according to claim 2, wherein an orthographic projection of the third light-shielding region on the base substrate is at least partially overlapped with an orthographic projection of the first electrode plate on the base substrate.

8. The display substrate according to claim 7, wherein an area of the orthographic projection of the third light-shielding region on the base substrate is larger than or equal to an area of the orthographic projection of the first electrode plate on the base substrate.

9. The display substrate according to claim 1, wherein the pixel drive layer further comprises a first gate insulating layer, the first gate insulating layer being disposed between the first electrode plate and the light-shielding region.

10. The display substrate according to claim 9, wherein the first gate insulating layer has a dielectric constant not less than 7.

11. The display substrate according to claim 1, wherein the light-shielding layer is made of an opaque metal material.

12. The display substrate according to claim 11, wherein the opaque metal material comprises metal tantalum.

13. The display substrate according to claim 1, wherein the first thin-film transistor is a low-temperature poly-silicon thin-film transistor.

14. The display substrate according to claim 1, wherein the second thin-film transistor is an oxide thin-film transistor.

15. The display substrate according to claim 1, wherein the pixel drive layer further comprises a first buffer layer, the first buffer layer being disposed between a second active layer of the second thin-film transistor and the light-shielding region.

16. The display substrate according to claim 1, further comprising a second buffer layer, the second buffer layer being disposed between the light-shielding region and the pixel drive layer.

17. A method for manufacturing a display substrate, comprising:
forming a light-shielding layer on a base substrate, wherein the light-shielding layer comprises a light-shielding region; and
forming a pixel drive layer on a side of the light-shielding layer away from the base substrate, wherein the pixel drive layer comprises at least one first thin-film transistor, at least one second thin-film transistor, and a first electrode plate of at least one storage capacitor, wherein the first thin-film transistor is disposed in correspondence with the light-shielding region, the second thin-film transistor is disposed in correspondence with the light-shielding region, and the first electrode plate is disposed in correspondence with the light-shielding region; and
wherein the first electrode plate is located between two adjacent first thin-film transistor and second thin-film transistor, and does not overlap with any of the two adjacent first thin-film transistor and second thin-film transistor; and
wherein the second thin-film transistor comprises a via hole which is configured to expose the light-shielding region in correspondence with the second thin-film transistor, the second thin-film transistor comprises a second active layer and a second gate layer, and the second active layer and the second gate layer are in the via hole.

18. The method according to claim 17, wherein forming the light-shielding layer on the base substrate comprises:
forming a thin film on the base substrate by using a light-shielding material; and
etching the thin film to form the light-shielding layer comprising the plurality of light-shielding regions.

19. The method according to claim 17, wherein prior to forming the pixel drive layer, the method further comprises:
forming a second buffer layer on the side of the light-shielding layer away from the base substrate.

20. A display apparatus, comprising a display panel, wherein the display panel comprises:
a base substrate;
a light-shielding layer disposed on the base substrate, the light-shielding layer comprising a light-shielding region;

a pixel drive layer disposed on a side of the light-shielding layer away from the base substrate, the pixel drive layer comprising at least one first thin-film transistor, at least one second thin-film transistor, and a first electrode plate of at least one storage capacitor, wherein the first thin-film transistor is disposed in correspondence with the light-shielding region, the second thin-film transistor is disposed in correspondence with the light-shielding region, and the first electrode plate is disposed in correspondence with the light-shielding region; and a display function layer disposed on a side of the pixel drive layer away from the base substrate; and wherein the first electrode plate is located between two adjacent first thin-film transistor and second thin-film transistor, and does not overlap with any of the two adjacent first thin-film transistor and second thin-film transistor; and wherein the second thin-film transistor comprises a via hole which is configured to expose the light-shielding region in correspondence with the second thin-film transistor, the second thin-film transistor comprises a second active layer and a second gate layer, and the second active layer and the second gate layer are in the via hole.

* * * * *